(12) United States Patent
Usenko

(10) Patent No.: US 11,456,204 B1
(45) Date of Patent: Sep. 27, 2022

(54) SILICON-ON-INSULATOR WAFER AND LOW TEMPERATURE METHOD TO MAKE THEREOF

(71) Applicant: Alexander Yuri Usenko, Lake St Louis, MO (US)

(72) Inventor: Alexander Yuri Usenko, Lake St Louis, MO (US)

( * ) Notice: Subject to any disclaimer, the term of this patent is extended or adjusted under 35 U.S.C. 154(b) by 0 days.

(21) Appl. No.: 17/221,824

(22) Filed: Apr. 4, 2021

(51) Int. Cl.
*H01L 21/762* (2006.01)

(52) U.S. Cl.
CPC .............................. *H01L 21/76256* (2013.01)

(58) Field of Classification Search
CPC .............. H01L 21/322; H01L 21/3221; H01L 21/3228; H01L 21/324; H01L 21/76251; H01L 21/76254; H01L 21/76256; H01L 21/76259; H01L 21/02672; H01L 21/02664; H01L 21/3225; H01L 121/3226
See application file for complete search history.

(56) References Cited

U.S. PATENT DOCUMENTS

| | | | | |
|---|---|---|---|---|
| 5,013,681 A | * | 5/1991 | Godbey | G03F 1/22 438/459 |
| 5,310,451 A | * | 5/1994 | Tejwani | H01L 21/76251 438/479 |
| 5,705,421 A | * | 1/1998 | Matsushita | H01L 21/76251 148/DIG. 12 |
| 6,958,282 B1 | * | 10/2005 | Huttner | H01L 29/78603 257/E21.415 |
| 2011/0140230 A1 | * | 6/2011 | Daval | H01L 21/76254 257/E21.561 |
| 2019/0088466 A1 | * | 3/2019 | Usenko | H01L 21/02387 |

* cited by examiner

*Primary Examiner* — Latanya N Crawford Eason

(57) ABSTRACT

A process for making silicon on insulator wafer by bond and etch back—BESOI. Fluorine ion implantation is performed after bonding and after removal of etch stop layers. The ion energy is chosen to have a peak of ion distribution near the wafer bonding interface. The ion dose is chosen to exceed silicon amorphization threshold at maximum ion distribution. The ion dose is chosen low enough to keep silicon surface crystalline. Solid phase epitaxy SPE is performed after the implant. Finalizing of wafer bonding is performed after the SPE by anneal at 800 C. SPE is performed by anneal where temperature is slow ramped up from 450 to 600 C. In further chipmaking process, defect generation as oxidation induced stacking faults—OISFs—during oxidation step is prevented. OISF are not generated even in metal contaminated wafers. As process does not includes high temperature anneal, RF SOI devices—like front chips of smartphones—made on these wafers have advanced RF performance. Process uses only standard equipment readily available at semiconductor foundries; therefore, the process can be easily implemented at foundries.

6 Claims, 3 Drawing Sheets

SILICON-ON-INSULATOR WAFER AND LOW TEMPERATURE METHOD TO MAKE THEREOF

REFERENCE TO RELATED APPLICATIONS

This application claims an invention which was disclosed in Provisional Application No. 63/005,389, filed Apr. 5, 2020, entitled "Silicon-on-insulator wafer and low temperature method to make thereof". The benefit under 35 USC § 119(e) of the United States provisional application is hereby claimed, and the aforementioned application is hereby incorporated herein by reference.

BACKGROUND OF THE INVENTION

Field of the Invention

The invention relates to methods of making silicon on insulator—SOI-wafers that can be further used for making chips. Preferably it is for making SOI wafers for radio frequency—RF applications, for example, for front end chips of smart phones.

Description of Related Art

Silicon on insulator—SOI-wafers are used as a starting material to make integrated circuits in cases when cheaper bulk silicon wafers cannot be used. For example, SOI used to make front end chips for cell phones. These are mixed signal chips and need to work at high frequencies of several gigahertz, therefore they cannot be made on bulk silicon wafers. Wafer makers and chip makers (foundries) are typically separate businesses. Currently SOI wafers are made by wafer makers. Though SOI is in between and can be manufactured either by wafer maker, or by foundry. However, in the art there is no method of making SOI wafer that use standard tools only that are readily available at foundries.

SOI wafers can be made various ways. Initially, in 1960s it was silicon-on-sapphire—SOS—technology. Later better methods were developed—SIPOS, SIMOX, BESOI, Eltran, Smart-Cut, etc., see Colinge, J-P. Silicon-on-insulator technology: materials to VLSI. Springer, 2004. Currently, only Smart-Cut process is used to make mainstream chips. BESOI is used only for niche applications as MEMS. All other processes are abandoned now as being inferior to the Smart-Cut.

This teaching describes how to make SOI wafers for mainstream applications using BESOI process on foundry facilities. BESOI stands for Bond-and-Etch-back SOI.

The BESOI process was initially developed by IBM in mid 1980s.—J. Lasky, Wafer bonding for silicon on insulator technologies, Appl. Phys. Lett. 48 (1986) 78. Later the BESOI process has been abandoned by IBM, and by the rest of industry. The major problem was high defect density in its cap silicon film. It is OISF type defect—oxidation induced stacking fault—Maszara, W. P., P. P. Pronko, and A. W. McCormick. "Epi-less bond-and-etch-back silicon-on-insulator by MeV ion implantation." Applied Physics Letters 58, no. 24 (1991): 2779-2781.

The OISF defects in silicon are formed when there are nucleation centers and a flux of interstitials. Typical nucleation center is a metal precipitate in Si. Oxidation of silicon generate interstitials, and the interstitial Si atoms diffuse through silicon lattice. Incoming interstitials sequentially attach to the nucleation center and form OISF rings. The rings have 10 nm to 1 mm size. The bigger defect size is, the higher probability that it will become a killer defect. OISF is big enough to be a killer. During CMOS chipmaking, OISF forms during gate oxidation or other oxidation steps and causes GOI—gate oxide integrity failure. Thus, the final chip malfunctions and the chips get rejected.

BESOI process includes BEOL (back of the line) steps. For example, it includes grinding away of sacrificial starting wafer. BEOL is heavily metal contaminating. Say, during the grinding, iron, nickel and other contaminants from grinding wheels diffuse through the device wafer toward Si-BOX interface. They become nucleation centers for OISF.

Smart-Cut process uses FEOL (front of the line) processing steps only. FEOL is essentially metal free. Therefore, there is no metal contaminations, no starting point for OISF grow, and the Smart-Cut-made SOI wafers are OISF free.

Still, the Smart-Cut process of making SOI has its own disadvantages. It requires specialized equipment that is not available at a typical foundry. For example, it needs high dose hydrogen ion implantation that requires a special ion implant tool. Also, wafer cleaving step in Smart-Cut requires a special tool that is not commercially available. Art would benefit from method for making OISF-free SOI wafers that based on using of standard foundry tools.

Both, Smart-Cut and BESOI include wafer bonding step. Thus, there is a bonding interface between the wafers. The bonding interface has defects that negatively affect performance of final chips. Defects at bonding interface can be reduced by annealing at 1100-1200 C thus improve chip yield. This way is not applicable for RF SOI-wafer that has an additional polysilicon layer below BOX and high resistivity handle wafer. Polysilicon loses its efficiency for RF performance if annealed at 1100 C or above. For example, $2^{nd}$ harmonic suppression deteriorates upon such anneal. The high resistivity handle wafer develops slips when annealed at high temperature. Art would benefit from low temperature method of making RF SOI wafers. As well, art would benefit from SOI fabrication process that is based on a standard tool set available at foundries.

SUMMARY OF THE INVENTION

BESOI type SOI wafer process for RF applications comprising the following process flow:
device and handle wafers are prepared:
device wafer: p− epi film is grown on a blanket p++ Si starting wafer. P− epi layer serves as an etch stop while etching away the sacrificial starting wafer. Optionally, more layers are grown over the p− epi—to make second etch stop and thus enable thinner and more uniform cap Si layer
handle wafer: poly film is deposited over high resistivity blanket wafer and BOX is grown from top of poly. BOX surface is polished with CMP.
bonding of the device and handle wafers
wafer surfaces are activated for bonding
wafers are aligned and mated
wafer assembly is annealed at 300 C
initial thinning
grinding away the sacrificial p++ wafer till few tens of microns left
selective chemical etching of reminder of the sacrificial wafer in HNA
fluorine implant
solid phase epitaxy of fluorine amorphized layer
final thinning by oxidation-strip cycles.

Fluorine implant in the middle of the thinning is the inventive step. F+ implant serves several functions:

(a) amorphize thin Si layer above the bonding interface to increase diffusion thus facilitate low temperature bonding, (b) preserve single crystalline silicon at the upper portion of the cap silicon film of SOI wafer. This upper portion serves as a seed during the next process step—solid phase epitaxy. The solid phase epitaxy finalizes wafer bonding at temperature ~600 C-800 C which is much lower than temperature needed to finalize the regular SiO2-SiO2 bonding (1100-1220 C), (c) disorder top portion of BOX SiO2 to increase diffusion. The enhanced diffusion further allows to finalize the wafer bonding at lower temperature as compared to bonding temperature of thermal oxide, (d) place a metal getter (fluorine) at desired location—in the bottom portion of the cap silicon film of SOI wafer. Iron, nickel and other metal impurities in cap Si thus are bound to fluorine. In this state they do not act as nucleation centers of OISFs. Eventually, OISFs are not formed during oxidation of the wafers, (e) Preserve the cap silicon from end-of-range—EOR—defects from ion bombarding. Energy of the fluorine implant is chosen that the maximum of ion distribution is near an interface between cap Si and BOX. EOR in silicon are formed in area below the peak of the implanted ions. Here SiO2, not Si is below the peak. SiO2 has no EOR defects. Implant-caused atomic displacements in SiO2 anneals out completely at oxidation temperatures—>750 C, (f) some of fluorine atoms collect at the interface and thus improve the interface electrical properties—as fluorine passivates interface states and efficiently lowers interface state density, (g) some implanted fluorine stays in BOX thus improving radiation hardness of chips made on these wafers and mitigated hot electron effects in the BOX.

In standard bonding, high temperature 1100-1200 C is needed to finalize wafer bonding. At this temperature polysilicon layer of RF SOI wafer is losing its trapping quality and RF performance of chips deteriorates. Inventive process uses much lower temperatures—below 600 C at solid phase epitaxy and below 800 C at oxidation/strip final thinning. Thus, RF properties of final chips are preserved. The major RF performance specs is $2^{nd}$ harmonic level. Typically, suppression of the $2^{nd}$ harmonic is 10 to 20 dB better in chips made by the inventive process compared to chips made by processes known in the art.

Fluorine in the cap silicon binds metal contaminations. Therefore, OISF defects are not formed in the cap silicon during its oxidation. Consequently, no GOI failures in the final chips. Chips on SOI made by known processes are extremely sensitive to metal contamination. Chips on inventive SOI wafers have much higher tolerance to metal contaminations. It results in higher chip yield.

Only standard tools readily available at foundries are used in the inventive process. New steps added to a standard BESOI process flow—fluorine implant and low temperature anneal can be routinely performed on standard ion implanters and owens. Thus, the process can be quickly implemented at foundries for in-house SOI and RF SOI wafer manufacturing. Finally, foundries save on making SOI chips.

DETAILED DESCRIPTION OF THE INVENTION $1^{st}$ Preferred Embodiment

This embodiment describes fabrication of a starting wafer for making RF (radio frequency) chips. Typical RF chips are front end chips for cell phones. They are mixed signal devices, so they have a digital CMOS part and an analog RF part. To enable RF operation, bottom (mechanical support) part of wafer has to be near dielectric, thus RF signal distortions as $2^{nd}$ harmonic is minimized. Therefore, these SOI wafers use very high resistivity handle and an additional undoped polysilicon film between the handle wafer and BOX—buried oxide film.

Figure 1:
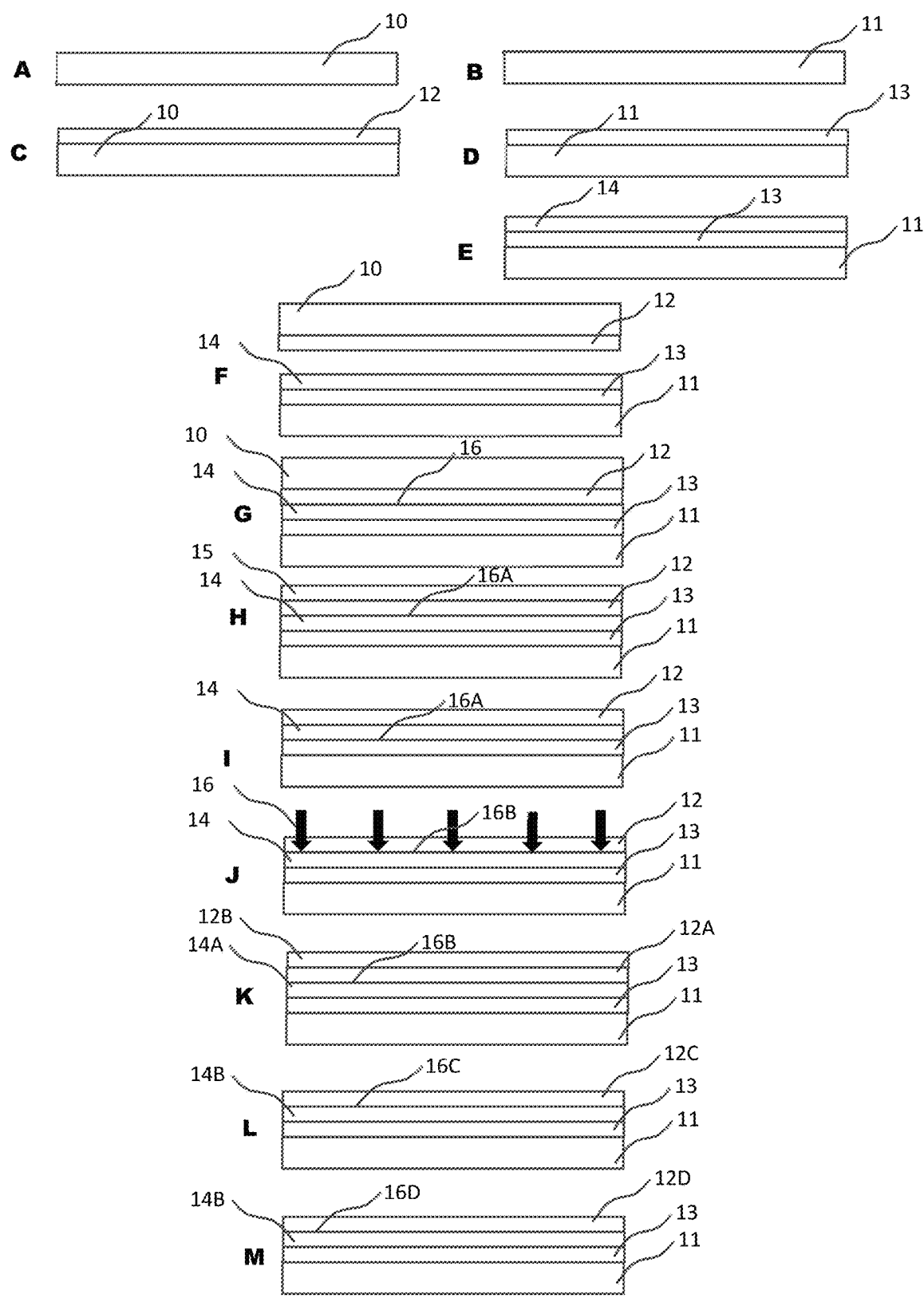
FIG. 1 shows a schematic BESOI process according to this invention.

Referring to FIG. 1 in operation A, a sacrificial wafer 10 for a device stack is chosen. The sacrificial wafer functions are:

give a lattice order for epitaxy of a film which further will become the main body for eventual chips. Epi film quality is determined by the substrate quality, therefore the sacrificial wafer still must have perfect crystalline quality;

be different from the epi film to an extent that it can be selectively removed (i.e., the removal stops as soon as the interface between the wafer and epi reached)

Typically p++ highly boron doped wafer is used. Ones skilled in art can determine right boron doping level of the sacrificial wafer, so the doping is high enough to facilitate fast etch in a selective etchant as HNA (HF-Nitric-Acetic acids mixture), but still low enough to enable the high quality epitaxial growth of a low doped film on it. Usually the doping level is in 1E18 cm-3 to 1E19 cm-3 range. This process step is similar to one known in the art thus not described in details here.

Referring to FIG. 1 in operation C, the silicon layer 12 is epitaxially grown on the sacrificial substrate 10. The epitaxial conditions such as temperature, feed gases, etc. are chosen to provide high quality (e.g., defect-free) epitaxial film and high throughput. Part of this epi film will ultimately become the main layer of the final SOI wafer-cap Si layer. Thus, quality of it is vital.

Referring to FIG. 1 in operation B, handle wafer 11 is chosen. Typically, very high resistivity wafer 5 to 10 kOhm-cm is used. High resistivity wafer have low oxygen content—to exclude thermal donor formation. Being low oxygen they are mechanically weak and easy develop slips if processed at 1100 C or above. Therefore one of purposes of this teaching is to provide low temperature manufacturing process thus get slip free final SOI wafers.

Referring to FIG. 1 in operation D, an undoped polysilicon film 13 is deposited onto the handle wafer 11. This step is similar to the art thus not described here in details.

Referring to FIG. 1 in operation E, a silicon dioxide BOX film 14 is grown by a thermal oxidizing of a top of the polysilicon film 13. Usual thicknesses of 13 and 14 layers are 2 microns and 0.2 microns respectively. After the oxidation, BOX surface has a roughness that is excessive for further bonding step. Therefore, chemical mechanical polishing—CMP—step is performed after the oxidation. This step is similar to the art thus not described here in details.

Referring to FIG. 1 in operation F, the device wafer stack—10,12 and handle wafer stack—11,13,14 are prepared for bonding. The device wafer is flipped to mate with the handle wafer by the epi side. The mating surfaces turn hydrophilic with plasma or wet process. This step is similar to the art thus not described here in details.

Referring to FIG. 1 in operation G, the device and handle stacks are aligned and mated. It creates a bonding interface 16. To prepare for further processing the bonding strength is increased by anneal at low temperature in vicinity of 300 C. This step is similar to the art thus not described here in details.

Referring to FIG. 1 in operation H, the sacrificial device wafer 10, which is typically 775 micron thick, is partially thinned by grinding. After the grinding the wafer assembly has about 30-micron thick leftover layer 15. During the grinding, metal contaminations diffuse from the grinding tool through the layer 15 and preferentially collect near the interface 16, thus forming a contaminated interface 16A. This step is similar to the art thus not described here in details. Though important is a recognition that the interface 16A is now got metal contaminated thus it causes OISF, GOI and yield issues in processes known in the art, see for example Maszara paper cited above.

Referring to FIG. 1 in operation I, the leftover layer 15 is completely removed by selective etching. Thus, the sacrificial wafer 10 is now removed completely. Only epi layer 12 that was grown on wafer 10 is left. Usually, wet selective etch in HNA (HF-nitric-acetic acid mixture) is used. This step is similar to the art thus not described here in details.

Referring to FIG. 1 in operation J, fluorine ion implantation is performed through the layer 12. This is an inventive step. In the art, fluorine implant was used to improve interface state density at gate-silicon interface in MOS transistors. Though it was not used in the claimed energy-dose combination. Neither F implant was used to form buried amorphous layer in Si and modified SiO2 layer. This combination allows to use F+ implant in conjunction with SPE. The inventive "F+-and-SPE" sequence results in several advantages—OISF suppression (thus high GOI yield), lower processing temperature (thus high RF performance of the chips).

The fluorine implant dose has to exceed the amorphization threshold in the peak of distribution, but keep below the threshold at ion distribution tails. This results in a buried amorphous layer covered with single crystalline silicon layer. The amorphous portion serves as an area where diffusion is higher compared to crystalline Si. This property is further used in the next step—solid phase epitaxy—to achieve complete wafer bonding at lower temperature. The superficial crystalline portion serves as a seed to grow the same orientation continuous crystalline silicon—at the next process step—SPE. For F+ ion implantation into silicon, the amorphization dose is known to be 1E15 to 2E15 cm-2. One skilled in the art can calibrate the implantation dose for specific implanter he uses—to be about 10% higher than the amorphization threshold in particular foundry conditions. Dose higher than 30% of the threshold dose for given tool is detrimental—as with higher dose the superficial crystalline seed becomes thinner and eventually amorphous portion extends to the surface. In this case, there is no seed for regrowth the Si film, thus SPE will result in poly, not single crystal Si.

Figure 3:
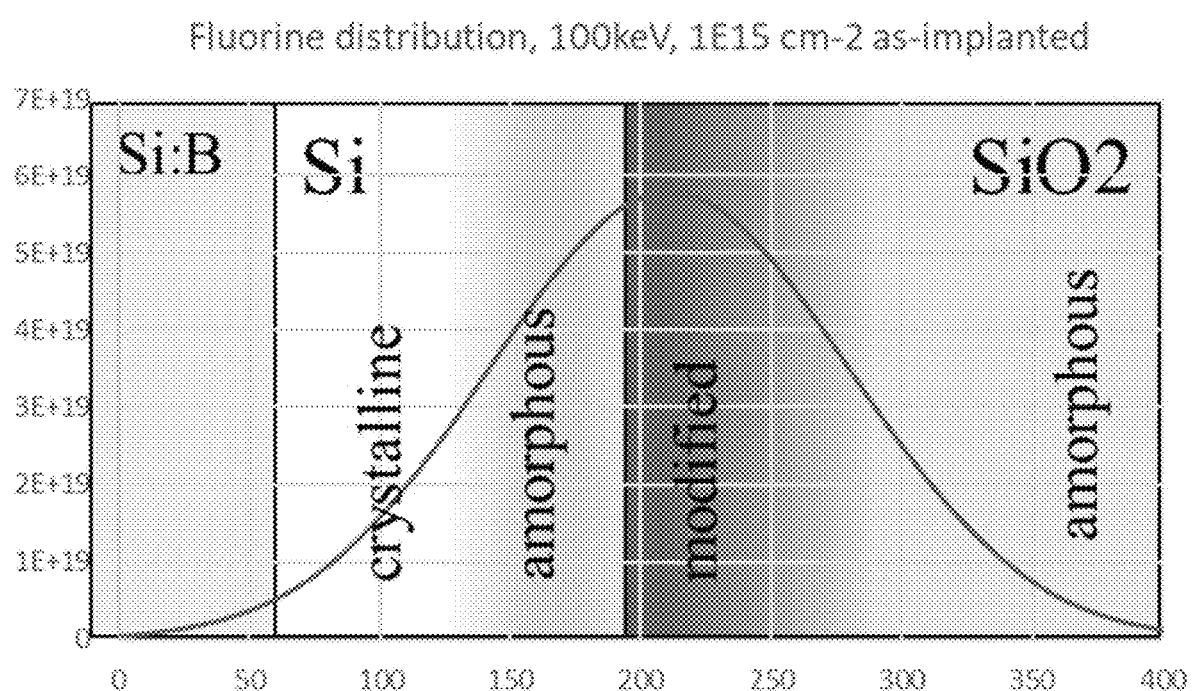
FIG. 3 shows typical as-implanted fluorine distribution.

Energy of the Fluorine implant has to be calculated so the peak location of the fluorine distribution coincides with the thickness of superficial Si film existing at given stage of thinning. The peak can be slightly deeper than the BOX interface. Referring to FIG. 3, an example is shown where the silicon film thickness is 200 nm, and F+ energy is 100 keV. Peak of the fluorine ion distribution in this case is located at 210 nm below the surface. If the energy is lower, ion peak will be closer to surface. In this case after the next SPE step, undesirable EOR type defects will appear in Si. If energy is higher, peak will be deeper inside of the BOX. In this case there is risk that an amorphous portion of Si will not be created. Consequently, lower bonding temperature will not be achieved.

Referring to FIG. 1 in operation J, the bonding interface is labeled 16B—as it is not the crystalline-to-oxide interface, but amorphous Si—to oxide one. Other phenomena as ion mixing also alter this interface.

Referring to FIG. 1 in step K, no operations, illustration that structure has changed. The former Si layer 12 has now upper crystalline portion 12A and lower amorphous portion 12B. The former BOX 14 is labeled 14A—as it contains now implanted fluorine and modified region were the implant caused atomic displacements.

Referring to FIG. 1 in operation L, solid phase epitaxy—SPE—of the amorphous portion of Si film created at the previous operation J is performed. J and K steps together comprise an inventive feature of this teaching. In general, the SPE is performed at temperature in a range between 450 and 600 C. However, proper range of temperature is narrower. If SPE anneal is at low temperature, the epitaxy propagates very slow, and the process takes excessively long time. If the SPE approaching 600 C, the epitaxy proceeds fast. If the complete epi regrowth takes less than about 1000 seconds, the quality of the regrown film decays—more stacking faults and other defect types are created. One skilled in the art can determine the proper temperature for the particular thickness of cap Si, etc. by running SPE at several temperatures and fixed SPE time, and determine the regrown thickness with TEM microscopy. From the results, the temperature required to complete the SPE in about 1000 s can be determined. This will be the optimal temperature. Alternatively, SPE can be performer by anneal with a slow ramp. For example, start at 450 C and increase the temperature at rate about 1 C/minute. In 150 minutes, the temperature reaches 600 C. At this point, SPE is definitely finished. During the SPE, a crystallization front propagates down toward BOX from initial location—as-implanted—amorphous-crystalline interface. Fluorine significantly redistributes during the SPE. Some fluorine diffuses toward surface and eventually leave the wafer. Some fluorine is pushed by crystallization front toward BOX. During this redistribution, fluorine passivates metal contaminations—thus facilitates OISF suppression. Also, F is segregated at Si-BOX interface thus stabilizing the electrical properties of the interface. In addition, several monolayers of water that were initially at the wafer bonding interface are removed from the interface through decomposition in H, O, and OH and diffusion away. SIMS spectra for F and O shows the final distribution.

Fluorine atom has smaller than Si size, thus diffuses by interstitial mechanism. It means the F diffusion proceeds at low temperature, quickly increasing above 550 C. Thus after SPE, Fluorine in cap silicon presents only were it is bound to defects—as metal contaminations, defects at bonding interface and in BOX. The BOX properties get improved by Fluorine—higher radiation hardness, and lower hot electron effects. Also F reservoir stored in BOX is ready to passivate bonding interface defects and incoming contaminants in cap Si.

Referring to FIG. 1, operation L, former interface 16B is now labeled 16C—as being crystalline-to-oxide again, and its properties are drastically changed due to water out diffusion and fluorine segregation. Also, the BOX undergo transformation thus labeled 14C: disordered area is annealed out, hydrogen from water at bonding interface is diffused away, oxygen from water together with fluorine changed stoichiometry and composition of the silicon dioxide.

Referring to FIG. 1, operation M, the final thinning of the cap Si 12D is performed. It can be done by oxidation—oxide strip cycles, typical temperature around 800 C. As this temperature is higher than SPE temperature, properties of the bonding interface change toward stabilizing and lowering interface state density. In contrast to processes known in the art, no OISF s are generated in the cap Si (12D)—consequence of fluorine doping. BOX 14B and polysilicon film 13 preserved with the same properties. They both have thermal stability up to at least 900 C. Important is that trapping activity of poly is preserved. Thus, RF performance of the chips—which is controlled by charge trapping properties of the poly.

Figure 2:
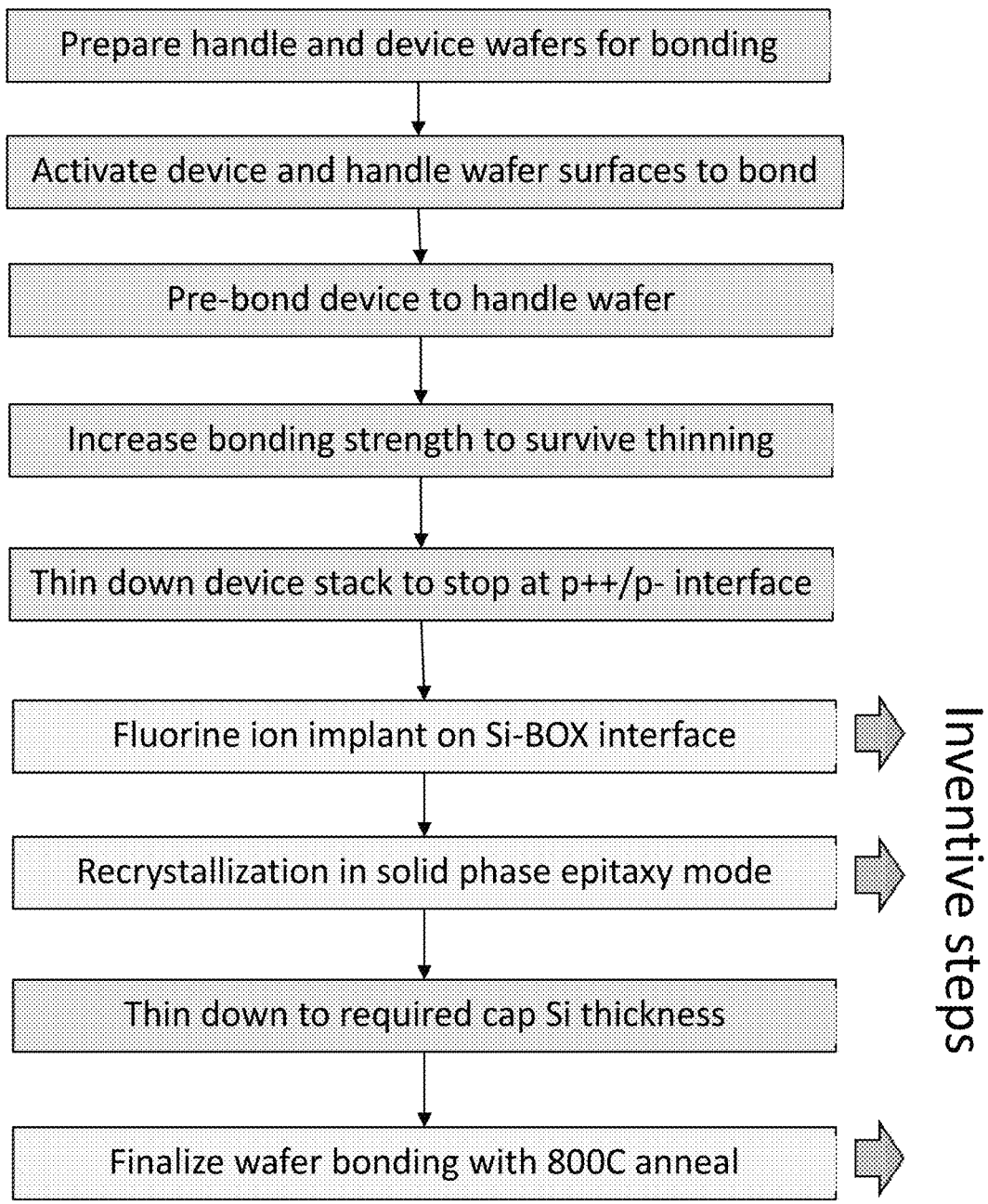
FIG. 2 shows an inventive process flow.

Referring to FIG. 2, the inventive process is illustrated as a process flow sequence.

Phenomena during the SPE in this BESOI process have some similarity to what happens in a SAB—surface activated bonding—developed by Prof. Suga team: Suga, Tadatomo "Low temperature bonding for 3D integration—A review of the surface activated bonding (SAB)." In 2012 3rd IEEE International Workshop on Low Temperature Bonding for 3D Integration, pp. 7-10. IEEE, 2012.

SAB is a low temperature bonding process. In a vacuum chamber, surfaces to be bonded are bombarded with argon ions. Near-surface layers of crystalline wafers become amorphized. Near surface layers of amorphous materials swell, get some porosity. Both near surface layers are in metastable state with an additional energy from the ion bombarding. Upon mating of the surfaces, high bonding strength immediately achieved. Upon slight anneal ~400-600 C bonding strength becomes equal to bulk. The bond finalizing temperature here is governed by solid phase epitaxy fronts moving from both bottoms of amorphized layers toward former bonding interface. In the disclosed process, the buried implanted layer is similar to SAB case—considering location of ion implant peak is the interface in SAB. Like in SAB, former bonding interface is finalized at much lower temperature then in a standard bonding.

Still the inventive process has a critical difference with the SAB. No need of ultrahigh vacuum as in SAB. No need of non-standard equipment. Only standard fab tools are used—bonder and implanter. Advantage—lowering of bonding temperature is only what is common.

Phenomena during the SPE in the inventive process are also somehow similar to the improving of interface quality observed in a modified SOS—silicon-on-sapphire process: Yoshii, Toshio, Shinji Taguchi, Tomoyasu Inoue, and Hiroyuki Tango. "Improvement of SOS device performance by solid-phase epitaxy." Japanese Journal of Applied Physics 21, no. S1 (1982): 175.

SOS has high defectivity in Si near Si-sapphire interface. This is due to lattice mismatch between Si and sapphire. To lower defect count, Si amorphizing implant with a peak at the interface is performed, followed by recrystallization in solid phase epitaxy mode—as described in papers cited where Si+ is implanted, not F+. In SOS case the implant/SPE sequence decreases defect count in Si and at interface by one-two orders of magnitude. Similar way we get improvements in the interface state density here.

Still there is a difference making this teaching inventive. Sapphire is not amorphized. It has much higher than Si amorphization threshold and strong self-anneal. Implant only bring Si contamination into sapphire, but almost no displacement defects. Diffusion rates at sapphire side are not affected. Interface improvement is solely to Si amorphization/SPE. Also, in SOS, Si+, not F+ is implanted thus no OISF suppression, and no F segregation at the interface facilitating low interface state density.

2$^{nd}$ Preferred Embodiment

The fluorine implant—FIG. 1 operation J is performed into a cooled wafer. Same as in the 1$^{st}$ embodiment, Fluorine dose has to exceed Si amorphization threshold. However, the threshold dose strongly depends on target temperature. For F+ into Si, the threshold is 1E15 to 2E15 cm-2, depending on ion beam current—at room temperature. Implanters currently available at fabs often are equipped with cryogenic chucks for wafer temperature below −50 C. At this temperature, the threshold dose for F+ into Si is about an order of magnitude lower ~2E14 cm-2. This allows high throughput using medium current implanters. One skilled in the art can determine the amorphization threshold dose for given implant temperature.

Subsequently, amount of Fluorine in the wafer is an order of magnitude lower. Though tests show that it is still sufficient for OISF suppression, and sufficient for lowering interface state density to a level close to thermal oxide interface. On the other side, Fluorine doping level is low enough to exclude any negative side effect on transistor performance in final chips.

3$^{rd}$ Preferred Embodiment

In some applications, specification on total thickness variation—TTV—for cap Si in SOI wafers are strict to the extent that BESOI processes with one etch stop layer cannot satisfy the TTV specs. In that case, double etch stop process flows are used. The first etch stop is typically p− epi film grown over the p++ sacrificial wafer. The second etch stop is usually a film inside of the p− epi. It can be so-called "boron etch stop" which is Si with electrically active boron dopant above 4E19 cm-2. Alternatively, the 2$^{nd}$ etch stop is SiGe layer with Ge content 30% or above, or SiGe:B film—which is a "strain compensated"-improved version of SiGe, etc. Referring to FIG. 3, the inventive Fluorine ion implantation step can be performed at the stage when the device stack thinning reaches the 2$^{nd}$ etch stop layer.

In this embodiment, the ion implantation energy is calculated to accommodate for an additional thickness of the 2$^{nd}$ etch stop. The implant energy can be calculated using any standard process simulation software used at foundries as Silvaco. Criteria remains the same—the peak of the fluorine concentration has to be at the cap Si-BOX interface, or in the BOX, slightly below the interface.

The invention claimed is:
1. A method for making silicon on insulator wafers comprising: preparation of a device wafer stack by epitaxy of etch stop layers and a cap silicon layer on a starting bare wafer; preparation of a handle wafer stack by deposition of a polysilicon film over a high resistivity wafer, wherein oxidation of an upper part of the polysilicon film forms a buried oxide, and planarizing of the oxide surface in said handle wafer stack; preparing wafer surfaces to be mated of said device wafer stack and said handle wafer stack for bonding by rendering said surfaces hydrophilic; bonding of said device wafer stack to said handle wafer stack; thinning of said device wafer stack by complete removal of said starting bare wafer and removal of said etch stop layers till said cap silicon film layer is exposed characterized in that a fluorine ion implantation is performed into said exposed cap silicon film layer and solid phase epitaxy is performed; and
bond finalizing anneal is performed.

2. The method of claim 1, wherein
ion energy of said fluorine implantation is chosen to have maximum distribution at or near an interface between said cap silicon and said buried oxide.

3. The method of claim 2, wherein
a dose of said fluorine implantation is chosen above amorphization threshold for bottom portion of said cap silicon and below amorphization threshold at upper portion of said cap silicon, and implantation is performed either at room or at cryogenic temperature.

4. The method of claim 2, wherein
said fluorine implantation is performed at said ion energy range from 20 to 200 keV and a dose in a range from 1E15 to 2E15 cm-2 implanted at room temperature.

5. The method of claim 1, wherein
said solid phase epitaxy is performed by annealing starting at 450° C. and continues at ramping up temperature at 0.1 to 10 degrees Celsius per minute until temperature 600° C. is reached.

6. The method of claim 1, wherein
said finalizing of wafer bonding is performed by anneal at 800° C.

\* \* \* \* \*